United States Patent [19]

Kitano

[11] Patent Number: 5,926,803
[45] Date of Patent: Jul. 20, 1999

[54] CIRCUIT DESIGNING METHOD AND CIRCUIT DESIGNING DEVICE

[75] Inventor: Hiroaki Kitano, Saitama, Japan

[73] Assignee: Sony Corporation, Tokyo, Japan

[21] Appl. No.: 09/170,541

[22] Filed: Oct. 13, 1998

Related U.S. Application Data

[63] Continuation of application No. 08/712,996, Sep. 10, 1996.

[30] Foreign Application Priority Data

Sep. 14, 1995 [JP] Japan .................................. 7-236512

[51] Int. Cl.⁶ ............................. G06F 15/18; G06F 17/50
[52] U.S. Cl. ............................. 706/13; 364/488; 364/491
[58] Field of Search ............................. 706/13; 364/488, 364/491

[56] References Cited

U.S. PATENT DOCUMENTS

| | | | |
|---|---|---|---|
| 5,390,282 | 2/1995 | Koza et al. | 706/13 |
| 5,615,124 | 3/1997 | Hemmi et al. | 364/488 |

FOREIGN PATENT DOCUMENTS 0 657 832   6/1995   European Pat. Off. ........ G06F 17/50

OTHER PUBLICATIONS

R.S. Martin and J.P. Knight, "Genetic Algorithms for Optimization of Integrated Circuits Synthesis," Proc. Int'l. Conf. on Genetic Algorithms, pp. 432–438, Jul. 1993.

V. Kommu and I. Pomeranz, "GAFPGA: Genetic Algorithm for FPGA Technology Mapping," Proc. European Design Automation Conf., pp. 300–305, Sep. 1993.

P. Thomson and J.F. Miller, "Optimisation Techniques Based on the Use of Genetic Algorithms for Logic Implementation on FPGAs," IEE Colloquim on 'Software Support and CAD Techniques for FPGAs, Abstract, Apr. 1994.

C. Biswas, I. Sen Gupta, "Technology mapping for lookup table based FPGAs using genetic algorithm," Proc. Int'l. Conf. on Computer Systems and Education, Abstract, Jun. 1994.

M. Davis, et al., "VLSI circuit synthesis using a parallel genetic algorithm," Proc. First IEEE Conf. on Evolutionary Computation, vol. 1, pp. 104–109, Jun. 1994.

J. Mizoguchi, et al., "Production genetic algorithms for automated hardware design through an evolutionary process," Proc. First IEEE Conf. on Evolutionary Computation, vol. 2, pp. 661–664, Jun. 1994.

D.H. Horrocks and Y.M.A. Khalifa, "Genetically derived filter circuits using preferred value components," IEE Colloquim 'Analogue Signal Processing', pp. 4/1–5. Oct. 1994.

H. Sakanashi, et al., "An approach for genetic synthesizer of binary decision diagram," Proc. of 1996 IEEE Int'l. Conf. on Evolutionary Computation, pp. 559–564, May 1996.

K. Ohmori, "High–Level Synthesis Using Genetic Algorithm," 1995 IEEE Int'l. Conf. on Evolutionary Computation, vol. 1, pp. 209–213, Dec. 1995.

(List continued on next page.)

*Primary Examiner*—Robert W. Downs
*Attorney, Agent, or Firm*—Frommer Lawrence & Haug, LLP.; William S. Frommer

[57] ABSTRACT

A circuit designing method and apparatus for the design of a large-scale logic circuit. A circuit configuration for a Programmable Logic Device (PLD) is revised in response to a genetic algorithm and then a logic circuit for providing a target output is designed. A collection of grammar rules for feeding out the PLD circuit configuration is applied as a chromosome, and the chromosome (a collection of grammar rules) is revised to feed out the chromosome giving the most suitable circuit configuration. The chromosome length is proportional to the number of grammar rules and does not depend upon the scale of the PLD circuit. Consequently, even for a large PLD circuit, it is possible to design the circuit configuration within a suitable calculating time.

12 Claims, 9 Drawing Sheets

OTHER PUBLICATIONS

T. Arslan, et al., "Structural synthesis of cell–based VLSI circuits using a multi–objective genetic algorithm," Electronics Letters, vol. 32(7), pp. 651–652, Mar. 1996.

A. Thompson, et al., "The Natural Way to Evolve Hardware," 1996 IEEE Int'l. Symp. on Circuits and Systems, vol. 4, pp. 37–40, May 1996.

T. Arslan, et al., "Structural Cell–based VLSI Circuit Design using a Genetic Algorithm," 1996 IEEE Int'l. Symp. on Circuits and Systems, vol. 4, p. 308–311, May 1996.

FIG. 5A  RULE 1  $A \to \begin{bmatrix} O & C \\ H & L \end{bmatrix}$

FIG. 5B  RULE 2  $F \to \begin{bmatrix} K & H \\ L & K \end{bmatrix}$

FIG. 5C  RULE 3  $H \to \begin{bmatrix} T & Q \\ J & T \end{bmatrix}$

FIG. 5D  RULE 4  $O \to \begin{bmatrix} Q & O \\ T & E \end{bmatrix}$

FIG. 6

F I G. 7A  CYCLE 0   O

F I G. 7B  CYCLE 1   QO
                     TE

F I G. 7C  CYCLE 2   OHQO
                     GATE
                     BEKQ
                     DCEB

F I G. 7D  CYCLE 3   QOTQOHQO
                     TEJTGATE
                     NMOCBEKQ
                     OFHLDCEB
                     NSKQIIOH
                     PDEBAPGA
                     TADMKQNS
                     KGTPEBPD

F I G. 7E  CYCLE 4   OHQOBEOHQOTQOHQO
                     GATEDCGATEJTGATE
                     BEKQFABENMOCBEKQ
                     DCEBIEDCOFHLDCEB
                     MIJEQODMNSKQIIOH
                     ALCPTETPPDEBAPGA
                     QOKHTQBTTADMKQNS
                     TELKJTGTKGTPEBPD
                     MITTIIOHQIQIQOTQ
                     ALDHAPGALMLMTEJT
                     HSTAKQNSOCHSNMOC
                     JAKGEBPDHLJAOFHL
                     BEOCTAJEIIOHMITT
                     DCHLKGCPAPGAALDH
                     IINMBEHSKQNSHSTA
                     APOFDCJAEBPDJAKG

CIRCUIT DESIGNING METHOD AND CIRCUIT DESIGNING DEVICE

This is a continuation of application Ser. No. 08/712,996, filed Sep. 10, 1996.

BACKGROUND OF THE INVENTION

1. Field of the Invention

This invention relates to a circuit designing device and a circuit designing method, and more particularly a circuit designing device and a circuit designing method in which a circuit configuration is changed in accordance with a genetic algorithm.

2. Description of the Related Art

In the case that a complex logical circuit for use in controlling a robot or the like was to be designed, a designer combined many basic logical elements to each other in accordance with his experience to design a logical circuit. However, in recent years, a method for designing a logical circuit without requiring any experience-based knowledge on the basis of a GA (genetic algorithm) has been introduced by Mr. Higuchi et al. as "a basic experiment of a hardware development through a genetic study" in the book entitled of "Genetic Algorithm (edited by Hiroaki Kitano, Sangyoh Tosyo Publishing Company)", for example.

In this prior art method, the circuit configuration of a PLD (Programmable Logic Device) represented by an FPGA (Field Programmable Gate Array) is repeatedly changed in response to the GA so as to make a logic device for performing a target output.

The PLD has a plurality of logical cells capable of dynamically selecting the type of basic logical calculations such as AND logical calculation, OR logical calculation or the like and can change the type of logical calculation performed by each of the logical cells and patterns of circuit connection between these logical cells.

In GA, items to cause the target to be most adapted are expressed by genes and then chromosome is generated by connecting these genes. Then, a plurality of chromosomes are repeatedly revised to cause the item to approach the most suitable state.

In the prior art, a function of the logical cell in the PLD and a pattern of circuit connection between the logical cells are expressed by chromosomes and the chromosomes (circuit configuration of PLD) are revised in response to GA so as to make a logical circuit performing a target output.

SUMMARY OF THE INVENTION

However, in the case that the logical circuit for use in performing a complex control, it is necessary to provide many logical calculation elements and so the connecting pattern between these logical calculation elements may become complex. Since the function of the logical cell in PLD and the pattern of circuit connection are expressed by the chromosomes in the prior art, a length of the chromosome becomes elongated in accordance with the number of logical cells. Accordingly, it has a problem that it requires a large amount of time due to the fact that it is necessary to perform a calculation based on a GA in respect to a quite long chromosome in the case that a large-scale logical circuit is to be designed.

The present invention has been invented in view of the aforesaid circumstances, wherein a function and a connecting pattern of the logical cells are generated through a collection of grammar rules composed of a predetermined number of grammar rules, these grammar rules are expressed by the chromosomes, the length of each of the chromosomes is not dependent upon the number of logical cells so as to enable a large-scaled logical circuit to be designed.

In an illustrative embodiment of the invention, a circuit designing device includes a calculating means capable of performing a calculation and changing dynamically a calculating function and a control means for changing a calculating function in such a way that an output of the calculating means may approach a target output in response to a genetic algorithm with a grammar rule for feeding out the calculating function being applied as a chromosome.

The circuit designing device may further provide an image for generating a tensor expressing the (n+l)th cycle from another tensor expressing the nth cycle, the image having a grammar rule composed of the image by performing a calculation against each of the elements of the tensor expressing the aforesaid nth cycle so as to expand each of the aforesaid elements to a secondary tensor.

DESCRIPTION OF THE PREFERRED EMBODIMENTS

Figure 1:
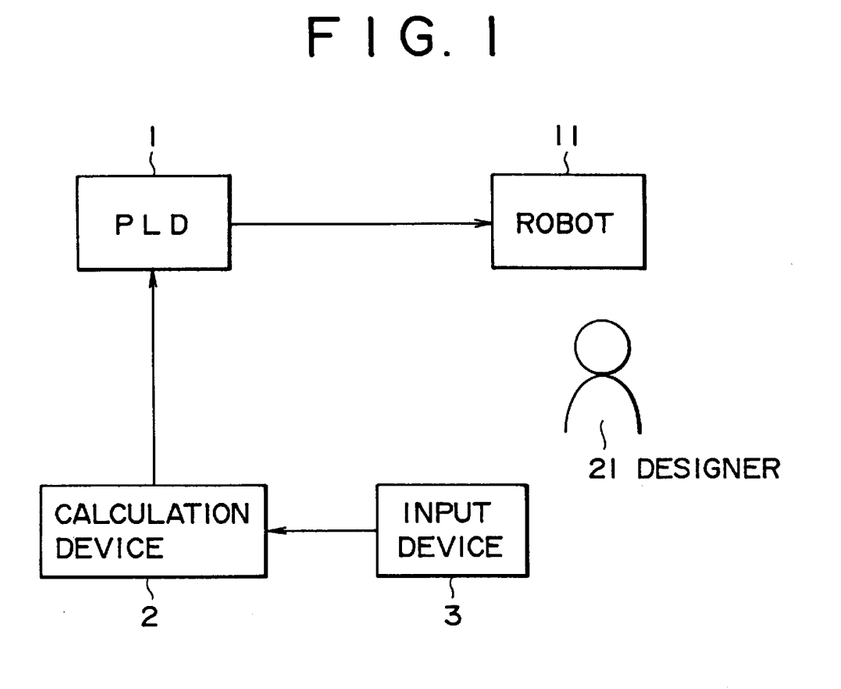
FIG. 1 is a block diagram of an illustrative configuration of one preferred embodiment of the circuit designing device of the present invention.

FIG. 1 shows an example of one preferred embodiment of the circuit designing device of the present invention. This example of configuration has a PLD 1 (a calculating means). The PLD 1 is connected to a calculation device 2 (a control means), changes its circuit configuration in response to the control signal of the calculation device 2 and outputs the control signal to a robot 11 under the configuration of the circuit.

The robot 11 is constructed to perform its operation in response to a control signal supplied from PLD 1. A designer 21 observes the operation of the robot 11, evaluates its operation in accordance with a predetermined evaluating method (an evaluation function), operates an input device 3 and inputs a value corresponding to the evaluation to the calculation device 2.

The calculation device 2 is constructed such that it holds a predetermined number of chromosomes, feeds out a circuit configuration of the PLD 1 and outputs it to PLD 1 as a control signal. In addition, after completion of the operation of the robot 11 and the evaluation of the designer 21 for all the chromosomes, the calculation device 2 is constructed such that a probability where many children and grand children of the chromosomes corresponding to a circuit configuration that realizes an operation of high evaluation is increased so as to revise the chromosomes in response to GA.

Figure 2:
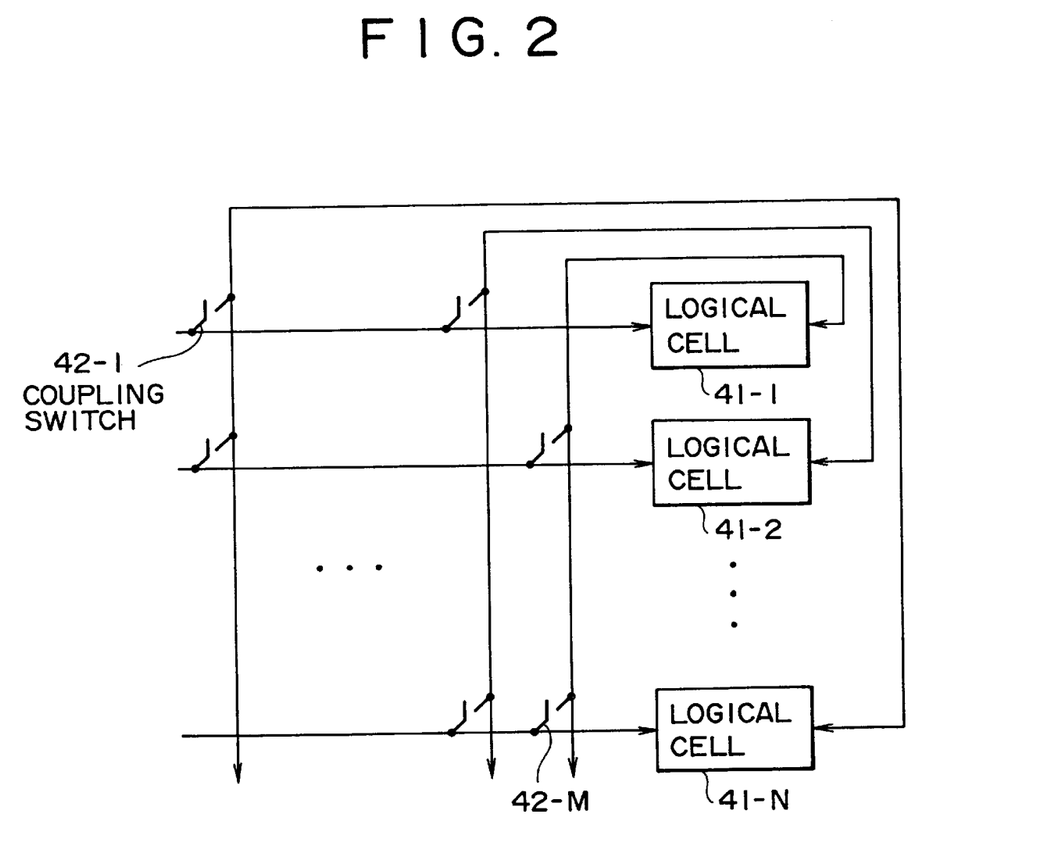
FIG. 2 is a block diagram of an illustrative configuration of PLD1 in the preferred embodiment shown in FIG. 1.

FIG. 2 shows an illustrative of configuration of PLD 1. This configuration is provided with a plurality of logical cells 41-1 to 41-N. These logical cells 41-1 to 41-N have a plurality of basic logical calculating functions such as AND logical calculation, OR logical calculation or the like and are constructed such that the kind of logical calculation to be executed is changed dynamically in accordance with a control signal supplied from an external part.

The logical cells 41-1 to 41-N are constructed such that any types of logical cells may be connected to each other and whether or not each of the logical cells is connected is determined by a control signal supplied externally. In the case that the logical cells are connected to each other, the corresponding coupling switches of the coupling switches 42-1 to 42-M are turned on. For example, in the case that the logical cell 41-N and the logical cell 41-1 are connected to each other, the coupling switch 42-1 is turned on.

Figure 3:
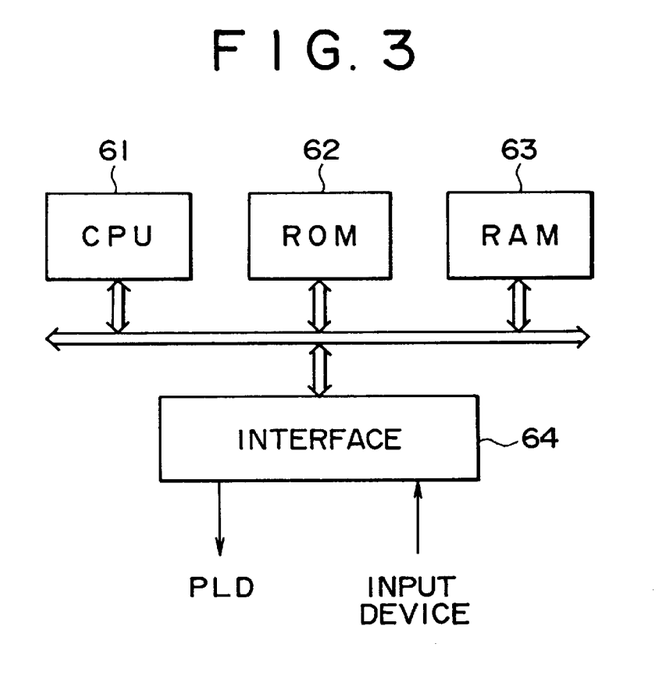
FIG. 3 is a block diagram of an illustrative configuration of a calculating device 2 in the preferred embodiment shown in FIG. 1.

FIG. 3 shows an illustrative configuration of the calculating device 2. This configuration has a CPU 61 and this CPU 61 is operated to carry out various processing operations in accordance with a program stored in ROM 62, and, for example, to calculate a new circuit configuration of PLD 1 in accordance with an evaluation of the operation of the robot in which the designer 21 operates the input device 3 to input information in accordance with the program stored in GA. RAM 63 stores data and programs required by CPU 61 when the CPU 61 performs various processing operation.

Evaluation in operation of the robot 11 inputted by the designer 21 is inputted from the input device 3 through an interface 64. Outputting of a control signal in respect to the PLD 1 is also carried out through the interface 64.

Figure 4:
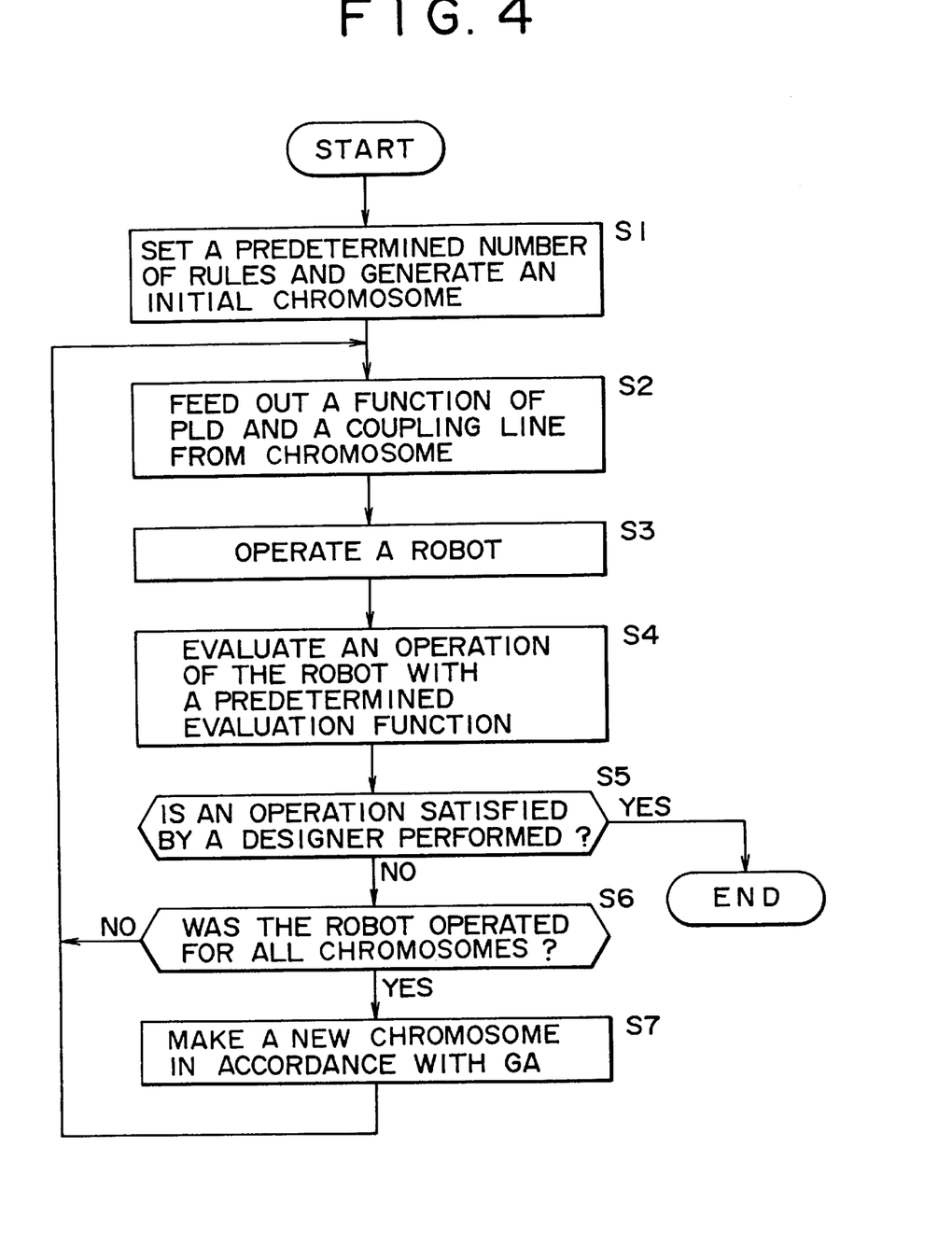
FIG. 4 is a flow chart for illustrating an operation of the preferred embodiment shown in FIG. 1.

Referring to the flow chart of FIG. 4, operation of the aforesaid preferred embodiment will now be described.

At first, at the step S1, the calculation device 2 makes a predetermined number of grammar rules. As shown in FIG. 5, each of the grammar rules has a matrix of 2×2 with one alphabet element being at a left side and each of the elements having an alphabet at a right side, respectively. The calculation device 2 makes genes in reference to the grammar rules and the predetermined number of genes connected to each other are applied as chromosomes. The calculation device 2 generates a predetermined number of initial chromosomes.

Figure 5A:
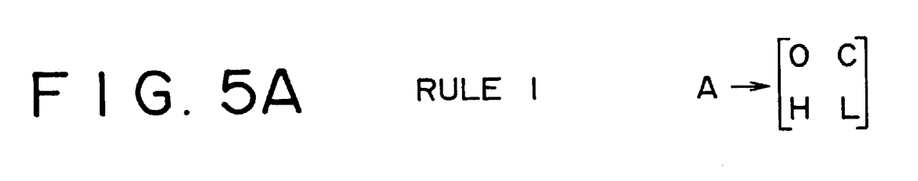
FIGS. 5A to 5D are diagrams illustrating examples of grammar rules utilized in the preferred embodiment shown in FIG. 1.
Figure 5B:
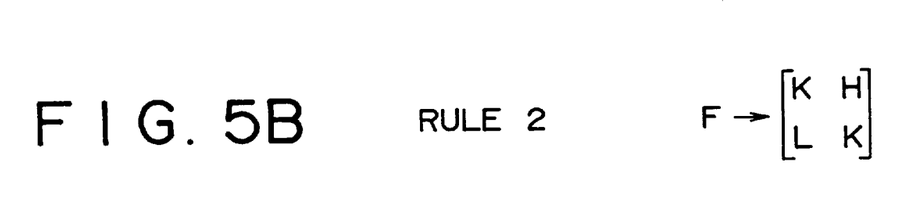
Figure 5C:
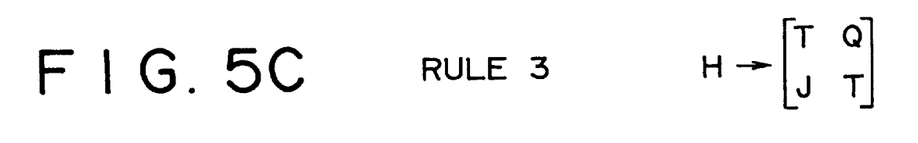
Figure 5D:
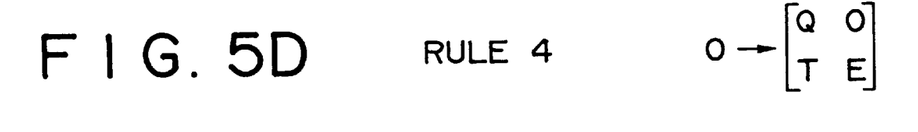
Figure 6:
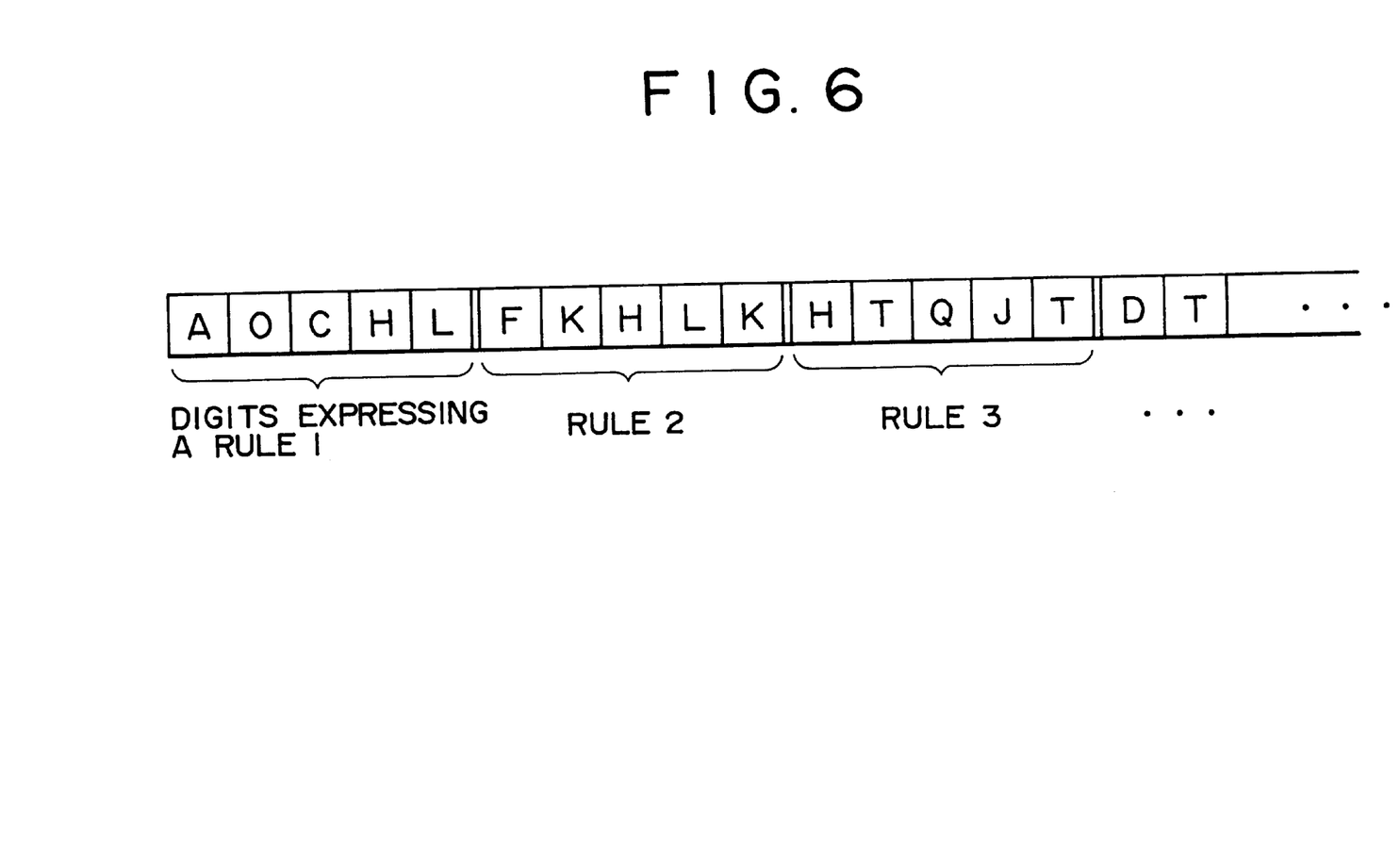
FIG. 6 illustrates gene utilized in the preferred embodiment shown in FIG. 1.

For example, in the case that the rule 1 in FIG. 5A is applied as a gene, the rule 1 is expressed as AOCHL. Accordingly, in the case that the rule 1 shown in FIG. 5A, the rule 2 shown in FIG. 5B and the rule 3 shown in FIG. 5C are expressed by genes and the chromosome beginning with these genes are to be described, they may be expressed as AOCHLFKHLKHTQJT . . . as shown in FIG. 6. In this way, a predetermined number of chromosomes having a predetermined length are made.

Figure 7A:
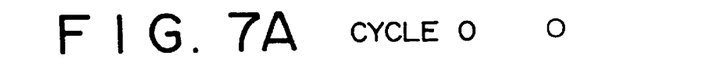
FIGS. 7A to 7E illustrate examples for developing matrixes in accordance with grammar rules shown in FIGS. 5A to 5D.
Figure 7B:
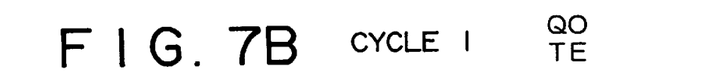
Figure 7C:
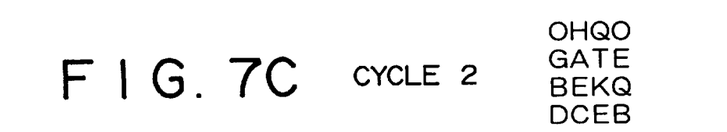

Then, at the step S2, these grammar rules are applied to generate a matrix of alphabets having a size corresponding to the number of logical cells 41-1 to 41-N in the PLD 1. For example, as shown in FIG. 7(a), one alphabet (O) is set at first, a grammar rule having this alphabet (O) at the left side, the rule 4 shown in FIG. 5D, for example, is applied to convert the alphabet (O) into a matrix of 2×2 shown in FIG. 7B. Then, as for each of the elements Q, O, T and E in this matrix of 2×2, a grammar rule (not shown) having these alphabets at the left side is applied to cause this matrix of 2×2 to be converted into a matrix of 4×4 shown in FIG. 7C.

Figure 7D:
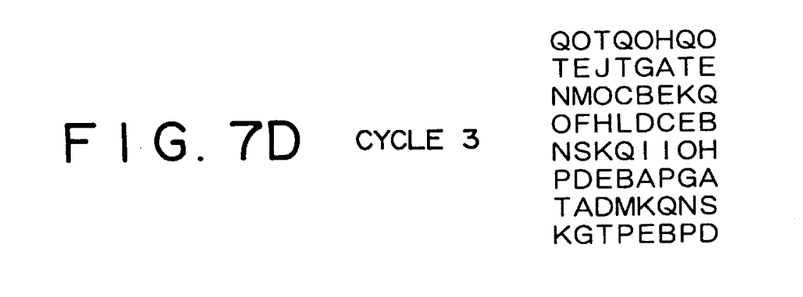
Figure 7E:
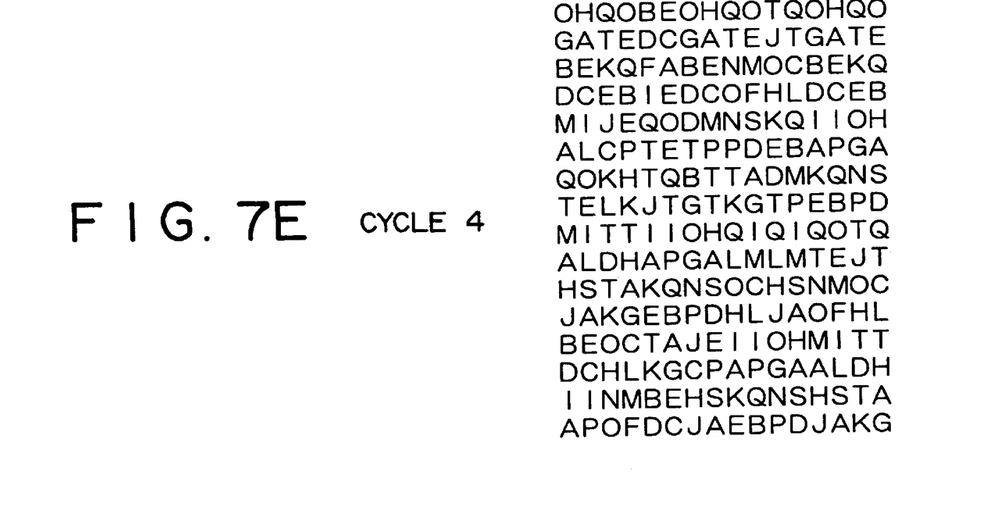

Similarly, when the grammar rule is applied to each of the elements of this matrix of 4×4, it becomes a matrix of 8×8 shown in FIG. 7D, and further when the grammar rule is applied to the elements of this matrix of 16×16 shown in FIG. 7E. In this way, the grammar rule is applied to each of the component elements of the matrix until the number of columns (=the number of rows) in the alphabet matrix is more than the number of logical cells 41-1 to 41-N in the PLD 1.

Accordingly, it is also possible to make a large-scaled alphabet matrix only with the predetermined number of grammar rules.

In the case that the number of logical cells 41-1 to 41-N is 16 (N=16), for example, it is satisfactory to have a size of the matrix shown in FIG. 7E and this alphabet matrix is converted to make a coupled state of the logical cells as well as a logical circuit coupling matrix expressing a function executed by each of the logical cells.

Figure 8:
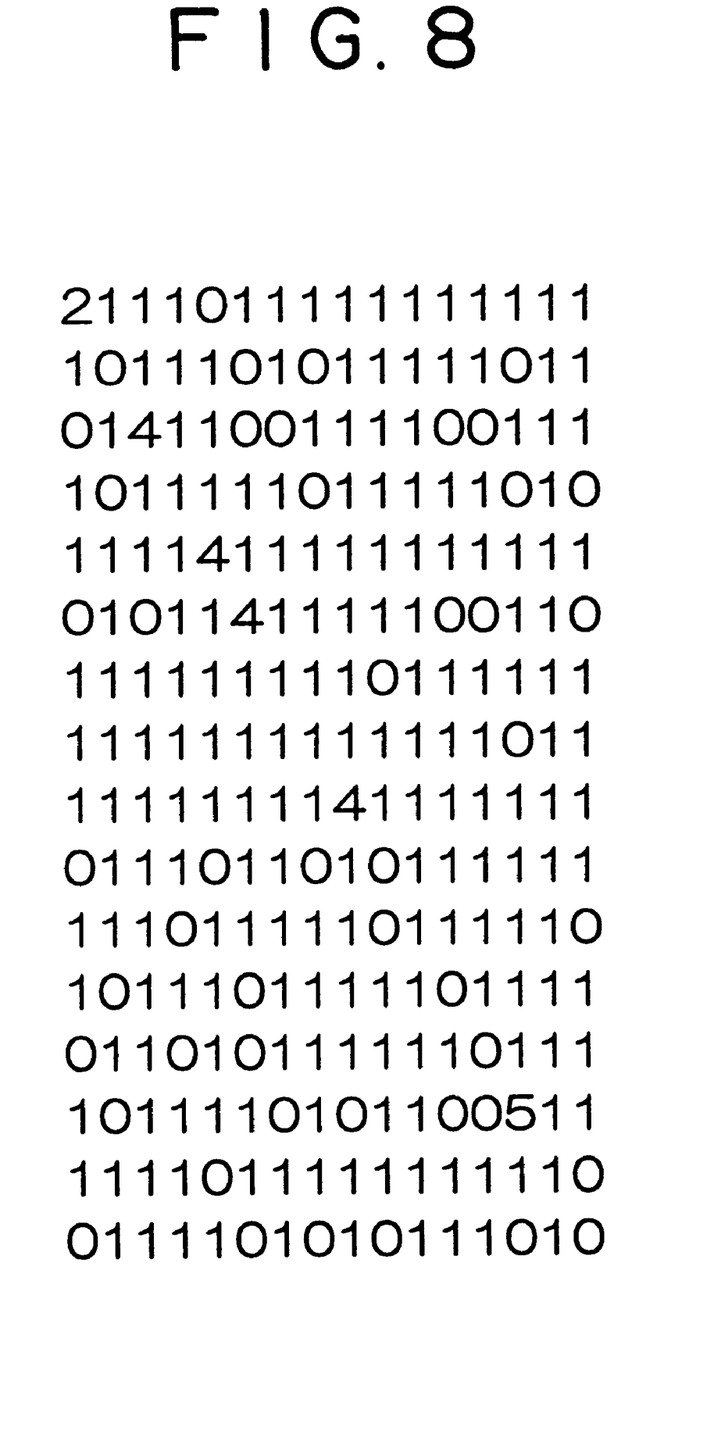
FIG. 8 illustrates an example of a logical circuit coupling matrix provided by the preferred embodiment shown in FIG. 1

Orthogonal components of the logical circuit connecting matrix express the functions of the logical cells 41-1 to 41-N and the right upper half components of the logical circuit connecting matrix express the connected states of the logical cells 41-1 to 41-N. For example, when the components of the i-th row and the j-th column in the logical circuit connecting matrix are expressed by Aij, the orthogonal component Aii is an integer of 0 to 5 and expresses the functions (AND logical calculation, OR logical calculation and the like) of the i-th logical cell 41-i in the case that all the number of functions of the logical cells 41-1 to 41-N are 6 as shown in FIG. 8.

In addition, the non-orthogonal component Aij is either 0 or 1 so as to express the connected state of the i-th logical cell 41-i and the j-th logical cell 41-j. In the case that Aij=1 is applied, Aij expresses that the logical cell 41-i and the logical cell 41-j are connected to each other and in turn in the case that Aij=0 is applied, Aij expresses that these logical cells 41-i and 41-j are not connected to each other. Accordingly, the connected state can be expressed only with either the upper right half components or the lower left half components in the matrix. In the example of this configuration, the upper right half components in the matrix are utilized.

Then, in order to make this logical circuit connecting matrix from the alphabet matrix shown in FIG. 7E, as for the orthogonal components of the alphabet matrix, they are converted into any one of 0, 1, 2, 3, 4, 5, 0, 1, 2, 3, . . . in the alphabetical order starting from A and in turn as for the non-orthogonal components, A, B, C are converted into 0 and other alphabets are converted into 1. With such an arrangement as above, the alphabet matrix shown in FIG. 7E can be converted into the logical circuit connecting matrix shown in FIG. 8.

In this way, the calculation device 2 may produce the logical circuit connecting matrix from the collection of the grammar rules and output it to the PLD 1 with this matrix being applied as a control signal. The PLD 1 may convert the circuit configuration (the function and the connected state of the logical cells 41-1 to 41-N) in accordance with this control signal.

Then, at the step S3, the PLD 1 operates the robot 11 in accordance with the logical circuit set at the step S2. The designer 21 observes the operation of the robot 11 and evaluates the operation in accordance with a predetermined evaluating method at the step S4, operates the input device 3 and inputs its evaluation into the calculation device 2.

At the step S5, the calculation device 2 judges in reference to the evaluation inputted by the designer 21 if the robot 11 performs the operation satisfied by the designer 21 and in the case that the robot 11 performs the operation satisfied by the designer 21, the calculation device 2 finishes the processing and in the case that the designer 21 does not satisfy the result, the operation advances to the step S6.

At step S6, it is determined if robot 11 is operated in response to all the chromosomes, the processings at the steps S2 to S5 are repeated until the robot 11 is operated for all the chromosomes, whereupon the operation advances to the step S7.

Then, at the step S7, the calculation device 2 performs three kinds of processing, i.e. a selecting processing, a crossing processing and a mutation processing in response to GA in reference to the evaluation performed by the designer 21 for the robot 11 for each of the chromosomes and produces a chromosome of a next generation.

In the selecting processing, the chromosomes are selected from a group of chromosomes in a probability proportional to an evaluation level of the designer 21 so as to make a pair of chromosomes. Accordingly, a probability of making many pairs is increased in respect to the chromosomes with high evaluation (realizing an operation of the robot 11) and so a probability of leaving many children and grand children to a next generation is increased.

In the crossing processing, locations where two chromosomes are crossed to each other under a certain disturbance number are determined for each of the pairs selected by the selecting processing and all the values of digits subsequent to the crossed digit are exchanged between the two chromosomes. For example, in the case that the chromosome AOCHLFKHLK . . . and the chromosome BTTDTCDMTP . . . are crossed to each other at the fourth digit counted from the left side, two chromosomes of the chromosome BTTDLFKHLK . . . and the chromosome AOCHTCDMTP . . . are made.

Mutation processing is carried out such that the alphabets at the digits determined by the random numbers are changed at the chromosome and this is performed at a certain low probability when a chromosome of next generation is made. In the case that the mutation processing is carried out, the digit to be changed is determined in reference to the random number and the alphabet at the digit is changed. For example, in the case that a mutation is generated at the third digit (alphabet A) of the chromosome JFAIEMJECP counted from the left, the chromosome after its processing becomes JFBIEMJECP.

After generating the chromosome of the next generation, the operation returns back to the step S2 and the processings at the step S2 to the step S7 are repeated until the designer 21 at the step S5 satisfies the operation of the robot.

As described above, a logical circuit for outputting a target signal is designed by revising the grammar rules (chromosomes) in response to GA with the collection of the grammar rules for feeding out the circuit configuration of PLD 1 being applied as chromosomes.

Figure 9:
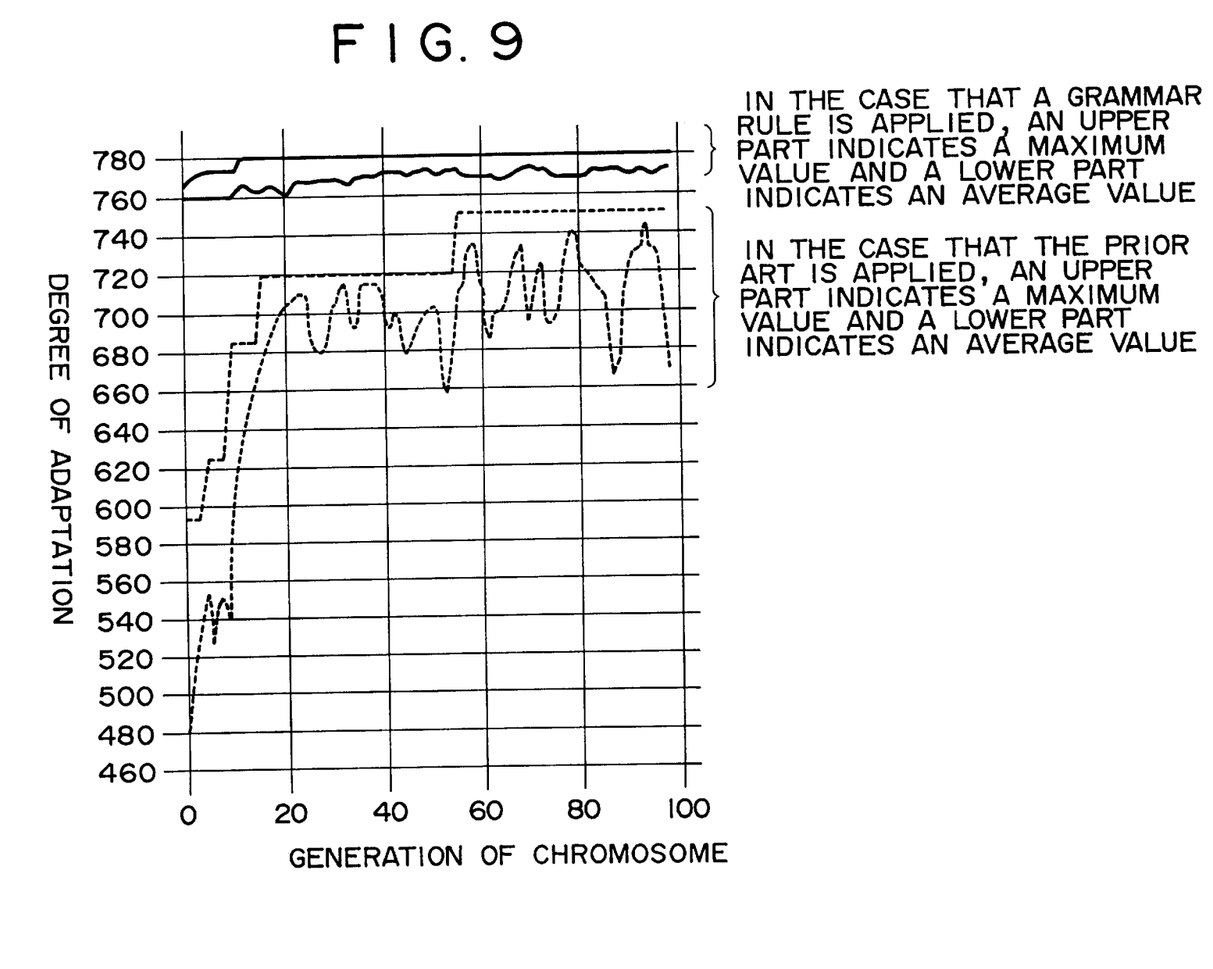
FIG. 9 illustrates a relation between a degree of adaptability and a generation of a gene when one example of an MXOR problem is resolved by applying one preferred embodiment of the present invention.

FIG. 9 illustrates a relation between a degree of adaptability and a generation of chromosome in the case that one example of MXOR (multiplex exclusive OR) is resolved in one preferred embodiment of the circuit designing circuit and its method of the present invention. The degree of adaptability is an index expressing how near an output of PLD expressed by each of the chromosomes approaches a target output. This problem of MXOR has an issue in which a relation between inputs and outputs of the logical circuit (16 inputs and 8 outputs) comprised of eight XOR logical elements with PLD having 64 logical cells.

A predetermined input is performed against PLD and then functions of the PLD are being revised with GA in such a way that a difference between it and the output (an answer to a problem) having 8 XORs may become low.

In this example, a degree of adaptability is 750 (a maximum value) even at 95-th generation in the case that the prior art is applied, and in turn in the case that the circuit designing device of the present invention and one preferred embodiment of the method are applied, chromosomes expressing the circuit configuration with the degree of adaptability being 780 at the 10-th generation and the circuit design can be rapidly performed.

Figure 10:
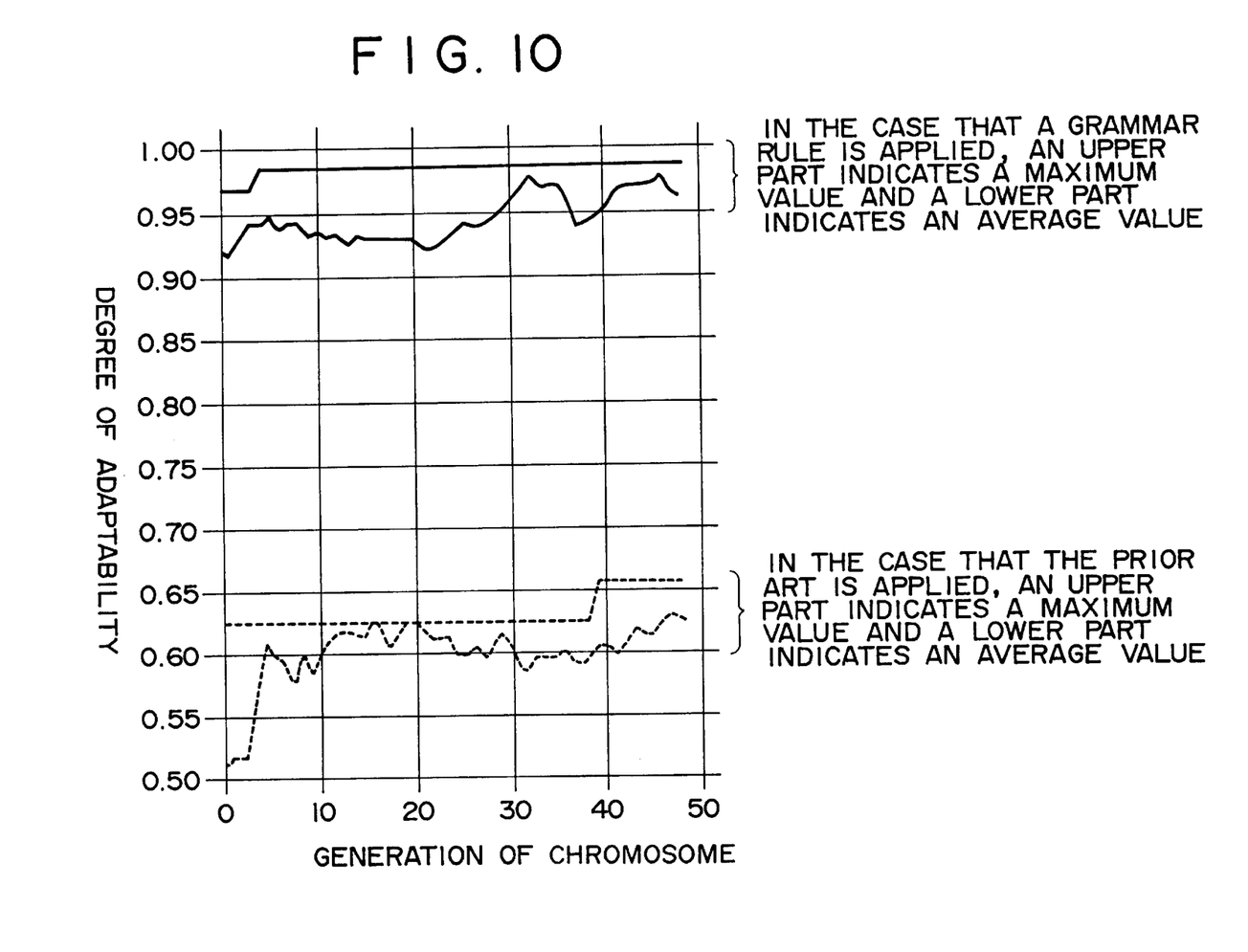
FIG. 10 illustrates a relation between a degree of adaptability and a generation of a gene when one example of a 6-multiplexor problem is resolved by applying one preferred embodiment of the present invention.

FIG. 10 illustrates a relation between a degree of adaptability and a generation of chromosomes in the case that one example of a 6-Multiplexer problem is resolved by one preferred embodiment of the circuit designing device and the method of the present invention.

The 6-Multiplexer has four input channels, two multiplexer signal channels and one output channel, wherein a value of one input channels of four input channels is outputted to the output channel in accordance with the value of the multiplex signal channel. Problem of the 6-Multiplexer has an issue to realize a relation between input and output of this 6Multiplexer.

In this example, inputs corresponding to the four input channels and two multiplex signal channels are carried out against PLD and the functions of the PLD are revised with GA in such a way that a difference between the output of PLD against the inputs and the output of the actual 6-Multiplexer (an answer of the issue) may become low.

In the case that the prior art is applied, a degree of adaptability is 0.66 (a maximum value) even at 45-th generation and in turn in the case that one preferred embodiment of the circuit designing device and the method of the present invention is applied, the chromosomes expressing the circuit configuration with a degree of adaptability being 0.98 appear and the circuit designing can be rapidly carried out.

In the aforesaid preferred embodiment, the control circuit of the robot 11 has been designed, although the present invention can be applied even to the design of the general type of logical circuit.

In the aforesaid preferred embodiment, an entire region of the logical circuit has been designed under utilization of GA, although it is possible to utilize the logical circuit as a part of the logical circuit to be newly designed by enclosing the grammar rules to the chromosomes of GA. In this case, as for the grammar rules to be enclosed, the crossing processing and the mutation processing are not carried out in GA, but the logical circuit of which design has already been enclosed in the logical circuit to be newly designed.

In accordance with the circuit designing device described in claim 1 and the circuit designing method described in claim 2 as mentioned above, the calculating function is changed in such a way that a result of the calculation may approach the target value on the basis of the genetic algorithm with the grammar rules for feeding out the calculating functions being applied as chromosomes, resulting in that a length of each of the chromosomes is proportional to the number of grammar rules, but not dependent upon a scale of the logical circuit and then a large-sized logical circuit can be designed rapidly and easily.

I claim:

1. A circuit designing device comprising:

calculating means capable of performing a calculation and changing dynamically a calculating function; and control means for changing said calculating function in such a way that an output of said calculating means may approach a target output in response to a genetic algorithm, with grammar rules for feeding out said calculating function being applied as chromosomes, and with lengths of individual chromosomes being independent of a scale of the circuit under design.

2. The circuit designing device described in claim 1, wherein said grammar rules provide an image for generating a tensor expressing the (n+1)th cycle from another tensor expressing the nth cycle, said image being an image generating a tensor expressing said (n+1)th cycle by performing a calculation against each of the elements of the tensor expressing said nth cycle so as to expand each of said elements to a secondary tensor.

3. The circuit designing device of claim 1 wherein said lengths of individual chromosomes are each proportional to the number of grammar rules.

4. The circuit designing device of claim 1 wherein the length of each chromosome is independent of a scale of the circuit under design.

5. A circuit designing method, comprising:

performing a calculation using a calculating function and dynamically modifying said calculating function in a manner such that a result of said calculation may approach a target value in response to a genetic algorithm, with grammar rules for feeding out said calculating function being applied as chromosomes, and with lengths of individual chromosomes being independent of a scale of the circuit under design.

6. The circuit designing method described in claim 5, wherein said grammar rules are images for generating a tensor expressing the (n+1)th cycle from another tensor expressing the nth cycle, and said images are images generating the tensor expressing said (n+1)th cycle by expanding each of said elements to a secondary tensor through calculation against each of the elements of the tensor expressing said nth cycle.

7. The method of claim 5 wherein said lengths of individual chromosomes are each proportional to the number of grammar rules.

8. The method of claim 5 wherein the length of each chromosome is independent of a scale of the circuit under design.

9. A method for designing a logic circuit having a plurality of logic cells, said logic circuit being operative to perform a control operation, said method comprising:

generating a plurality of chromosomes, each being composed of plural grammar rules in accordance with a genetic algorithm, with lengths of individual chromosomes being independent of the number of logic cells, said plurality of chromosomes defining a circuit configuration of said logic circuit;

evaluating said control operation in accordance with an evaluation criteria; and dynamically modifying said chromosomes in accordance with said evaluation.

10. The method of claim 9 wherein said lengths of individual chromosomes are each proportional to the number of grammar rules.

11. The method of claim 9 wherein said control operation comprises a control operation for a robot.

12. The method of claim 9 wherein the length of each chromosome is independent of the number of logic cells.

* * * * *